(12) United States Patent
Choi et al.

(10) Patent No.: US 10,636,761 B2
(45) Date of Patent: Apr. 28, 2020

(54) METHOD OF FABRICATING A SEMICONDUCTOR PACKAGE

(71) Applicant: Electronics and Telecommunications Research Institute, Daejeon (KR)

(72) Inventors: Kwang-Seong Choi, Daejeon (KR); Yong-Sung Eom, Daejeon (KR); Keon-Soo Jang, Daejeon (KR); Seok Hwan Moon, Daejeon (KR); Hyun-Cheol Bae, Sejong-si (KR); Ieeseul Jeong, Seoul (KR); Wagno Alves Braganca Junior, Incheon (KR)

(73) Assignee: Electronics and Telecommunications Reearch Institute, Daejeon (KR)

( * ) Notice: Subject to any disclaimer, the term of this patent is extended or adjusted under 35 U.S.C. 154(b) by 2 days.

(21) Appl. No.: 16/115,060

(22) Filed: Aug. 28, 2018

(65) Prior Publication Data

US 2019/0067235 A1 Feb. 28, 2019

(30) Foreign Application Priority Data

Aug. 29, 2017 (KR) .......................... 10-2017-0109723
Jun. 15, 2018 (KR) .......................... 10-2018-0069201

(51) Int. Cl.
*H01L 23/00* (2006.01)
*B23K 26/20* (2014.01)

(52) U.S. Cl.
CPC .............. *H01L 24/32* (2013.01); *B23K 26/20* (2013.01); *H01L 24/09* (2013.01); *H01L 24/13* (2013.01); *H01L 24/16* (2013.01); *H01L 24/29* (2013.01); *H01L 24/81* (2013.01); *H01L 24/83* (2013.01); *H01L 2224/0401* (2013.01);
(Continued)

(58) Field of Classification Search
CPC ........... H01L 24/32; H01L 2224/81224; H01L 2224/16227; H01L 2224/83224; H01L 2224/81192; B23K 1/0056; B23K 26/20
See application file for complete search history.

(56) References Cited

U.S. PATENT DOCUMENTS 5,952,718 A * 9/1999 Ohtsuka ................ H01L 21/563
257/737
2009/0311810 A1 12/2009 Yang et al.
(Continued)

FOREIGN PATENT DOCUMENTS

KR 10-2015-0094125 A 8/2015
KR 10-2017-0057909 A 5/2017

OTHER PUBLICATIONS

Jung-Hun Seo et al., "A Simplified Method of Making Flexible Blue LEDs on a Plastic Substrate", IEEE Photonics Journal, vol. 7, No. 2, Apr. 2015.

*Primary Examiner* — William F Kraig
*Assistant Examiner* — Khatib A Rahman
(74) *Attorney, Agent, or Firm* — Rabin & Berdo, P.C.

(57) ABSTRACT

Provided is a method of fabricating a semiconductor package. The method includes preparing a package substrate having a substrate pad, and mounting a semiconductor chip on the substrate pad. Mounting the semiconductor chip includes forming a resin layer containing a solder and reducing agent granules having a first capsule layer, between a chip pad of the semiconductor chip and the substrate pad, and bonding the chip pad to the substrate pad using laser irradiated to the semiconductor chip.

11 Claims, 10 Drawing Sheets

(52) U.S. Cl.
CPC ............... *H01L 2224/16227* (2013.01); *H01L 2224/32225* (2013.01); *H01L 2224/73204* (2013.01); *H01L 2224/81192* (2013.01); *H01L 2224/81224* (2013.01); *H01L 2224/81424* (2013.01); *H01L 2224/81447* (2013.01); *H01L 2224/83224* (2013.01); *H01L 2224/92125* (2013.01); *H01L 2924/1434* (2013.01); *H01L 2924/3511* (2013.01)

(56) References Cited

U.S. PATENT DOCUMENTS

| | | | |
|---|---|---|---|
| 2011/0171883 A1* | 7/2011 | Allison | B24B 37/205 |
| | | | 451/6 |
| 2011/0226515 A1 | 9/2011 | Son et al. | |
| 2011/0260179 A1 | 10/2011 | Hung | |
| 2011/0284265 A1 | 11/2011 | Sakai et al. | |
| 2014/0227684 A1* | 8/2014 | Hindson | C12Q 1/6876 |
| | | | 435/6.1 |
| 2015/0228617 A1 | 8/2015 | Lee et al. | |
| 2015/0303130 A1* | 10/2015 | Kim | H01L 21/56 |
| | | | 257/737 |
| 2015/0368407 A1* | 12/2015 | Zhang | B01J 13/22 |
| | | | 428/402.21 |
| 2016/0212823 A1* | 7/2016 | Kim | H05B 33/22 |
| 2017/0141071 A1* | 5/2017 | Choi | H01L 21/4853 |
| 2019/0276817 A1* | 9/2019 | Hindson | C12N 15/11 |

\* cited by examiner

METHOD OF FABRICATING A SEMICONDUCTOR PACKAGE

CROSS-REFERENCE TO RELATED APPLICATIONS

This U.S. non-provisional patent application claims priority under 35 U.S.C. § 119 of Korean Patent Application No. 10-2017-0109723, filed on Aug. 29, 2017 and Korean Patent Application No. 10-2018-0069201, filed on Jun. 15, 2018, the entire contents of which are hereby incorporated by reference.

BACKGROUND

The present disclosure herein relates to a method of fabricating a semiconductor package, and more particularly, to a method of fabricating a semiconductor package having improved reliability.

Recently, the development of information technique contributes to the development of various kinds of semiconductor packages. The semiconductor packages are mostly mounted on a package substrate. The package substrate may include a hard substrate and a flexible substrate. The hard substrate may include PET, PEN, polyimide, glass, silicon or sapphire. The flexible substrate may mostly include a polymer. The flexible substrate may be vulnerable to heat during conducting a package process.

SUMMARY

The present disclosure provides a method of fabricating a semiconductor package, which may reduce the warpage of a substrate during conducting a bonding process.

The task to solve in the present disclosure is not limited to the aforementioned task, and unmentioned other tasks may be precisely understood from the description below to a person skilled in the art.

An embodiment of the inventive concept discloses a method of fabricating a semiconductor package. The method includes preparing a package substrate having a substrate pad, and mounting a semiconductor chip on the substrate pad. Here, Mounting the semiconductor chip includes forming a resin layer between a chip pad of the semiconductor chip and the substrate pad, and bonding the chip pad to the substrate pad using laser irradiated to the semiconductor chip. The resin layer comprises a solder and reducing agent granules having a first capsule layer. Bonding the chip pad to the substrate pad includes removing the first capsule layer by heat generated from the laser, removing first to third metal oxide layers on the substrate pad, the solder, and the chip pad using the reducing agent granules; and connecting the chip pad to the substrate pad.

In an embodiment, the reducing agent granules may further include a second capsule layer in the first capsule layer, and curing agent granules in the second capsule layer.

In an embodiment, the second capsule layer may have a melting point higher than the melting point of the first capsule layer.

In an embodiment, the first capsule layer may include polyphenylene sulfide and the second capsule layer may include polyether ether ketone.

In an embodiment, the resin layer may further include a base material layer.

In an embodiment, the method may further include removing the second capsule layer using the heat generated by the laser, and curing the base material layer using the curing agent granules.

In an embodiment, the curing agent granules may include aliphatic amines, aromatic amines, cycloaliphatic amines, phenalkamines, imidazoles, carboxylic acids, anhydrides, polyamide-based hardeners, phenolic curing agents, or waterborne curing agents.

In an embodiment, the reducing agent granules may include bulky group-substituted hydroxyl compounds or carboxylic acids.

In an embodiment, the solder may include solder powders. Mounting the semiconductor chip may further comprise providing the semiconductor chip on the resin layer.

In an embodiment, the solder may include a solder ball. Mounting the semiconductor chip may further comprise forming the solder ball on the substrate pad, and providing the semiconductor chip on the solder ball.

In an embodiment, the resin layer may further include a base material layer, and a curing agent which is mixed in the base material layer to cure the base material layer by the heat of the laser.

In an embodiment, bonding the chip pad to the substrate pad may further include pressing the semiconductor chip into the package substrate by using a transparent block.

BRIEF DESCRIPTION OF THE FIGURES

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings.

DETAILED DESCRIPTION

Figure 1:
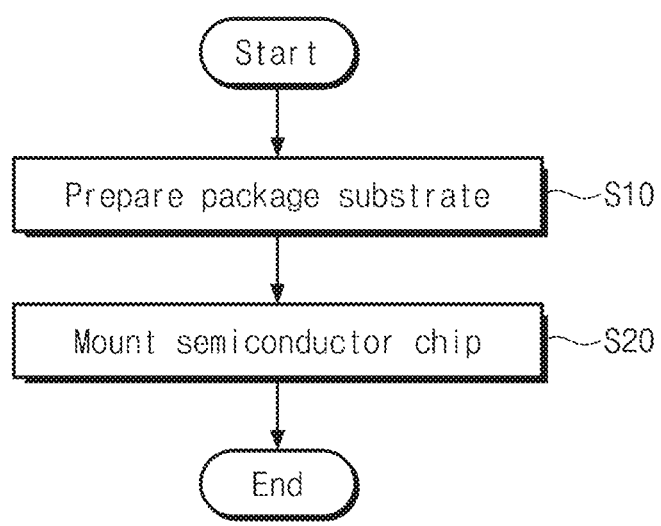
FIG. 1 is a flowchart showing a method of fabricating a semiconductor package according to the inventive concept.

The advantages and the features of the inventive concept, and methods for attaining them will be precisely described in example embodiments below with reference to the accompanying drawings. The inventive concept may, however, be embodied in different forms and should not be construed as limited to the embodiments set forth herein. Rather, these embodiments are provided so that this description will be thorough and complete, and will fully convey the scope of the present inventive concept to those skilled in the art. The inventive concept will be defined by the scope of claims. Like reference numerals refer to like elements throughout.

The terminology used herein is for the purpose of describing example embodiments only and is not intended to limit the present inventive concept. As used herein, the singular forms are intended to include the plural forms as well, unless the context clearly indicates otherwise. It will be further understood that the terms "comprises" and/or "comprising," when used in this specification, specify the presence of stated features, steps, operations, and/or devices, but do not preclude the presence or addition of one or more other features, steps, operations, and/or devices thereof.

In addition, example embodiments are described herein with reference to cross-sectional views and/or plan views that are schematic illustrations of idealized example embodiments. In the drawings, the thicknesses of layers and regions may be exaggerated for effective explanation of technical contents. As such, variations from the shapes of the illustrations as a result, for example, of manufacturing techniques and/or tolerances, are to be expected. Thus, example embodiments should not be construed as limited to the particular shapes of regions illustrated herein but are to include deviations in shapes that result, for example, from manufacturing. For example, an etched region illustrated as a rectangle will, typically, have rounded or curved features. Thus, the regions illustrated in the figures are schematic in nature and their shapes are not intended to illustrate the actual shape of a region of a device and are not intended to limit the scope of the present inventive concept.

FIG. 1 shows a method of fabricating a semiconductor package according to the inventive concept.

Referring to FIG. 1, the method of fabricating a semiconductor device of the inventive concept may include a step of preparing a package substrate (S10) and a step of mounting a semiconductor chip (S20).

FIGS. 2 to 6 are process cross-sectional views showing the method of fabricating the semiconductor package of FIG. 1.

Figure 2:
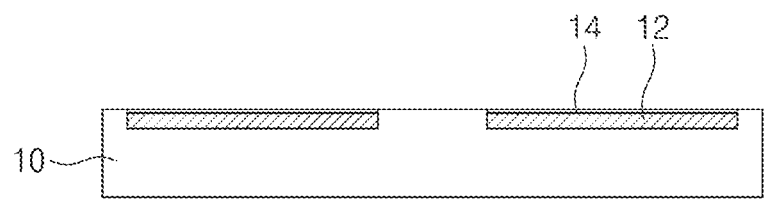
FIGS. 2 to 6 are process cross-sectional views showing the method of fabricating a semiconductor package of FIG. 1.

Referring to FIGS. 1 and 2, a package substrate 10 is prepared (S10). For example, the package substrate 10 may be a printed circuit board, a silicon substrate or an interposer substrate. According to an embodiment, the package substrate 10 may have substrate pads 12. The substrate pads 12 may be exposed from the top surface of the package substrate 10. The substrate pads 12 may include a conductive metal of copper or aluminum. The substrate pads 12 each may have a first metal oxide layer 14. The first metal oxide layer 14 may be formed on the top surface of the substrate pad 12. The first metal oxide layer 14 may have a thickness of about 10 nm or less. The first metal oxide layer 14 may be a native oxide layer.

Referring to FIGS. 1 and 3 to 6, a semiconductor chip 30 is mounted on the package substrate 10 (S20). The semiconductor chip 30 may include an application processor (AP) chip, a memory chip, a graphic chip, a display device chip, or a lighting chip.

Figure 7:
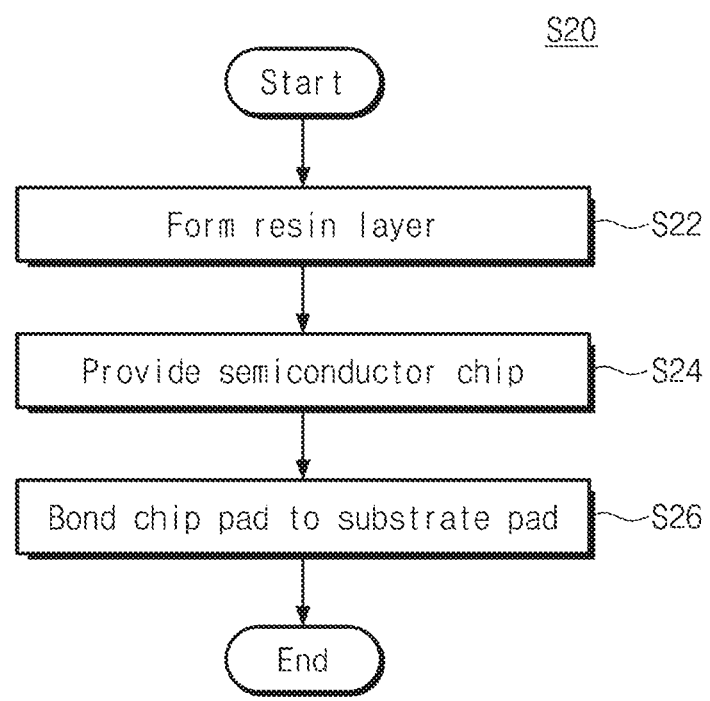
FIG. 7 is a flowchart showing an embodiment of mounting a semiconductor chip of FIG. 1.

FIG. 7 shows an embodiment of mounting the semiconductor chip 30 of FIG. 1 (S20).

Referring to FIG. 7, the step of mounting the semiconductor chip 30 (S20) may include a step of forming a resin layer (S22), a step of providing a semiconductor chip (S24), and a step of bonding chip pads to substrate pads 12 (S26).

Referring to FIGS. 3 to 7, a resin layer 20 is formed on the substrate pads 12 (S22). The resin layer 20 may be applied on the substrate pads 12 by a printing method or a dropping method. The resin layer 20 may be a non-conductive film (NCF) or a non-conductive paste (NCP). The resin layer 20 may be formed so as to have a thickness of about 2 µm to about 100 µm. According to an embodiment, the resin layer 20 may include a base material layer 22, solder powders 24 and reducing agent granules 26.

The base material layer 22 may include a thermosetting resin. For example, the base material layer 22 may include epoxy, phenoxy, bismaleimide, unsaturated polyester, urethane, urea, phenol-formaldehyde, vulcanized rubber, melamine resin, polyimide, epoxy novolac resin, or cyanate ester.

The solder powders 24 may be provided in the base material layer 22. For example, the solder powders 24 may include Sn, In, SnBi, SnAgCu, SnAg, Sn, In, AuSn, InSn, BiInSn or InSn. The solder powders 24 may have a diameter of about 1 µm to about 100 µm.

Figure 3:
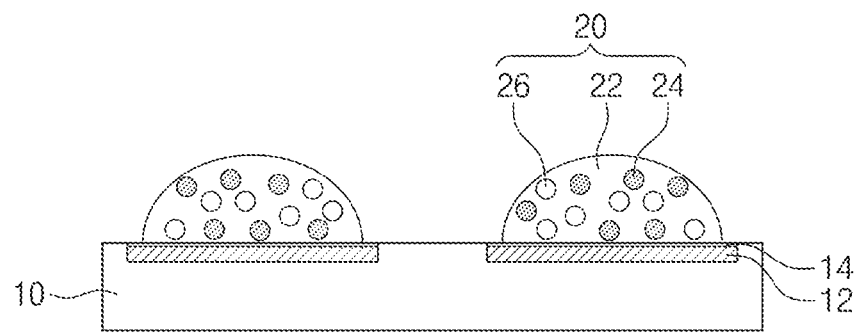
Figure 8:
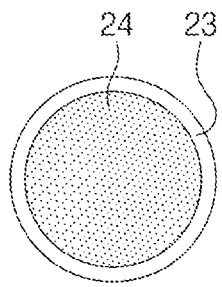
FIG. 8 is a cross-sectional view showing an embodiment of a solder powder in FIG. 3.

FIG. 8 shows an embodiment of a solder powder 24 of FIG. 3.

Referring to FIG. 8, the solder powders 24 may have a second metal oxide layer 23. The second metal oxide layer 23 may enclose the solder powder 24. The second metal oxide layer 23 may have a thickness of about 10 nm or less. The second metal oxide layer 23 may be a native oxide layer.

Referring to FIG. 3, the reducing agent granules 26 may be mixed with the solder powders 24 in the base material layer 22. The reducing agent granules 26 and/or reducing agent grains may have a similar diameter to the diameter of the solder powders 24. For example, the reducing agent granules 26 may have a diameter of about 1 µm to about 1 mm.

Figure 9:
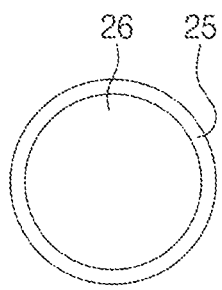
FIG. 9 is a cross-sectional view showing a reducing agent granule in a resin layer in FIG. 3.

FIG. 9 shows a reducing agent granule 26 in the resin layer 20 of FIG. 3.

Referring to FIG. 9, each reducing agent granule 26 may have a first capsule layer 25. The first capsule layer 25 may enclose each reducing agent granule 26. The first capsule layer 25 may include a thermoplastic resin. According to an embodiment, the first capsule layer 25 may have a melting point of a threshold temperature of about 80° C. or higher.

For example, the first capsule layer 25 may include polyether ether ketone (PEEK), polyphenylene sulfide (PPS), liquid crystalline polymers, polytetrafluoroethylene (PTFE), polysulfone (PSU), polyether sulfone (PES), polyphenyl sulfone (PPSU), polybenzimidazole (PBI), polyimide (PI), polyamideimide (PAI), or PMMA.

The reducing agent granules 26 may be protected from exterior by the first capsule layer 25. The reducing agent granule 26 may include hydroxyl compounds or carboxylic acids which are substituted with a bulky group (phenyl, phenol, sulfone, sulfide, etc.). For example, the reducing agent granule 26 may include hydrates of carboxylic hydrate, hydroxyl hydrate, or phenolic hydrates, or compounds having high melting point among compounds having the removing function of an oxide layer.

Figure 4:
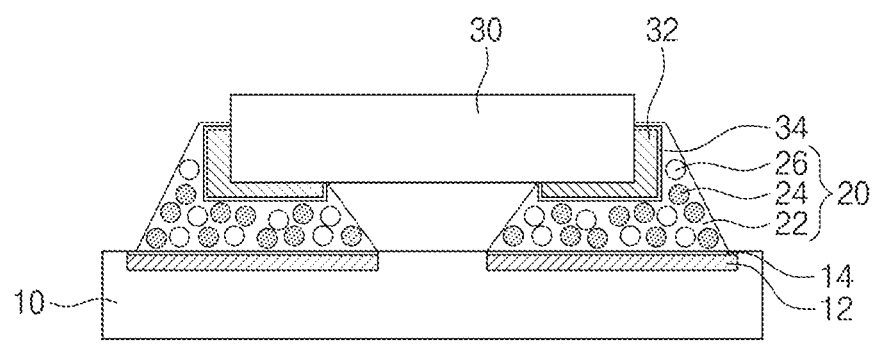

Referring to FIGS. 4 and 7, a semiconductor chip 30 is provided on the resin layer 20 (S24). The semiconductor chip 30 may be provided on the resin layer 20 by the picker of a chip bonding apparatus. The semiconductor chip 30 may have a thickness of about 5 µm to about 1 mm.

Figure 5:
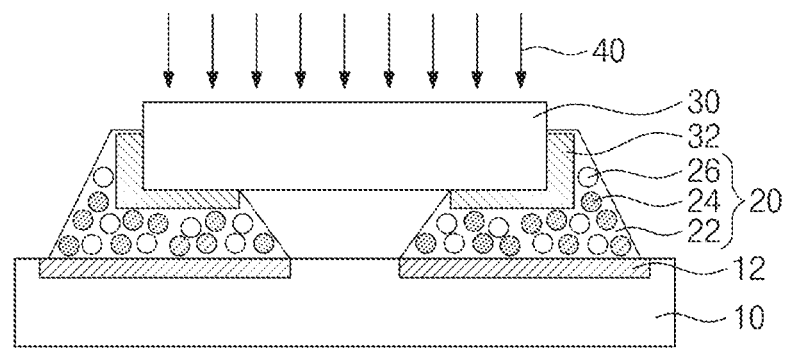
Figure 6:
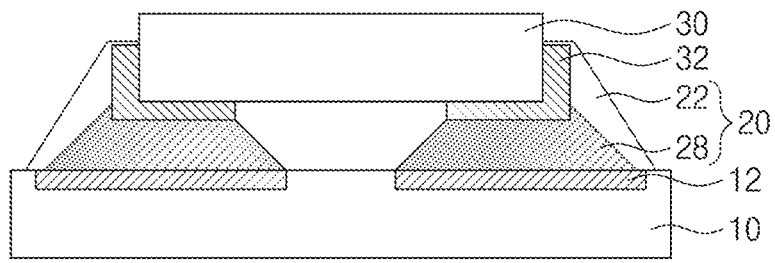

Referring to FIGS. 5 to 7, laser light 40 is applied to the semiconductor chip 30 to bond the chip pads 32 into the substrate pads 12 (S26). The semiconductor chip 30 may be bonded to the substrate pad 12 by the heat of the laser light 40. The laser light 40 locally heats the semiconductor chip 30 and the resin layer 20 below the semiconductor chip 30 so that the warpage of the substrate 10 may be decreased.

Figure 10:
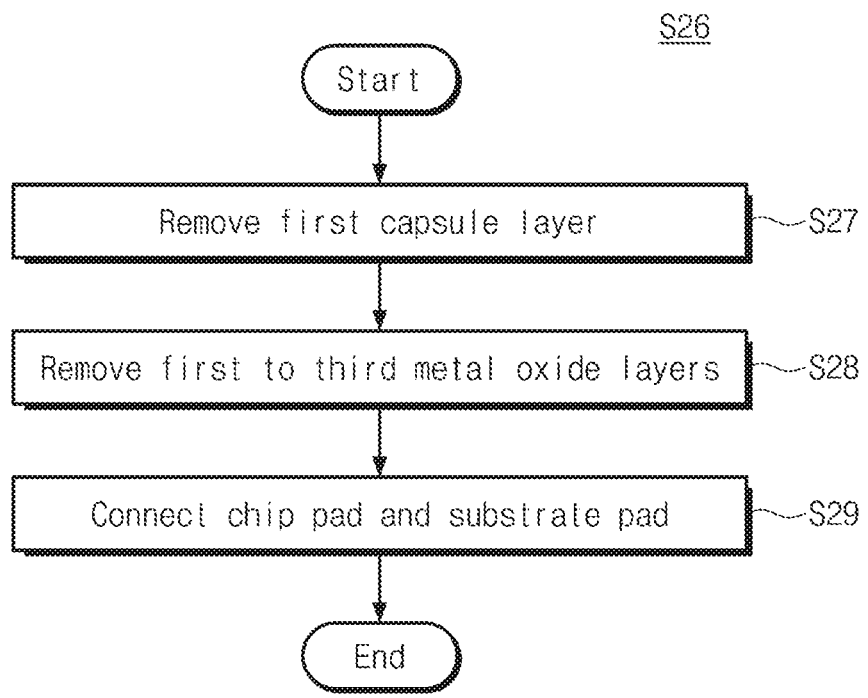
FIG. 10 is a flowchart showing an embodiment of bonding a chip pad to a substrate pad in FIG. 7.

FIG. 10 shows an embodiment of bonding the chip pad 32 to the substrate pad 12 of FIG. 7 (S26).

Referring to FIG. 10, the step of bonding the chip pad 32 to the substrate pad 12 (S26) may include a step of removing the first capsule layer 25 (S27), a step of removing the first to third metal oxide layers 14, 23 and 34 (S28), and a step of connecting the chip pad 32 to the substrate pad 12 (S29).

Referring to FIGS. 5, 9 and 10, the first capsule layer 25 is removed using the heat of the laser light 40 (S27). If the laser light 40 is supplied to the semiconductor chip 30, the semiconductor chip 30 and the resin layer 20 may be heated by the heat of the laser light 40. The heat generated by the laser light 40 may heat the semiconductor chip 30 and the resin layer 20 to a temperature of about 230° C. to about 370° C. The temperature may be changed according to the exposure amount of the laser light 40 and/or the exposure intensity of the laser light 40. The laser light 40 may be, for example, helium-neon laser light, argon laser light, UV laser light, IR laser light, or Excimer laser light. The laser light 40 may have a wavelength of about 500 nm to about 2 μm. If the resin layer 20 is heated, the first capsule layer 25 at the outer circumference of the reducing agent granule 26 may be molten and/or removed. The molten first capsule layer 25 may remain in the base material layer 22 as particles.

If the first capsule layer 25 is removed, the reducing agent granules 26 remove the first to third metal oxide layers 14, 23 and 34 (S28). Each of the first to third metal oxide layers 14, 23 and 34 may be reduced to a metal by the oxidation reaction of the reducing agent granules 26. By the heat generated by the laser light 40, the reducing agent granules 26 may be oxidized, and the first to third metal oxide layers 14, 23 and 34 may be reduced. The oxidized reducing agent granules 26 may be dissolved or remain as particles in the base material layer 22. Differently, the first metal oxide layer 14 may be removed from the substrate pad 12. The second metal oxide layer 23 may be removed from the solder powders. The third metal oxide layer 34 may be removed from the chip pad 32.

Referring to FIGS. 6 and 10, the chip pad 32 is connected with the substrate pad 12 (S29). The solder powders 24 may be molten by the heat of the laser light 40. The molten solder powders 24 may be combined and/or agglomerated from each other by surface tension to form a bonding junction layer 28. The bonding junction layer 28 may connect the chip pad 32 and the substrate pad 12.

Though not shown, the resin layer 20 may include a curing agent. The curing agent may be provided in the base material layer 22. The curing agent may cure the base material layer 22 by the heat of the laser light 40. The curing agent may include aliphatic amines, aromatic amines, cycloaliphatic amines, phenalkamines, imidazoles, carboxylic acids, anhydrides, polyamide-based hardeners, phenolic curing agents or waterborne curing agents. The cured base material layer 22 may enclose the outer circumference of the bonding junction layer 28. The bonding junction layer 28 may be protected by the base material layer 22.

Figure 11:
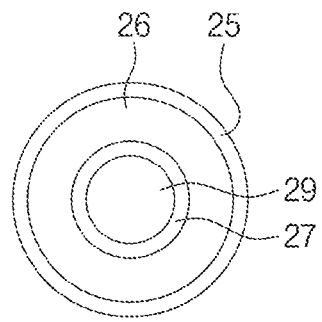
FIG. 11 is a cross-sectional view showing a reducing agent granule in FIG. 3.

FIG. 11 shows an embodiment of the reducing agent granule 26 of FIG. 3.

Referring to FIG. 11, the reducing agent granule 26 may have first and second capsule layers 25 and 27, and a curing agent granule 29.

The first capsule layer 25 may enclose the reducing agent granule 26. The first capsule layer 25 may protect the reducing agent granule 26.

The second capsule layer 27 may be formed in the reducing agent granule 26. The reducing agent granule 26 may enclose the second capsule layer 27. The second capsule layer 27 may include polyether ether ketone (PEEK), polyphenylene sulfide (PPS), liquid crystalline polymers, polytetrafluoroethylene (PTFE), polysulfone (PSU), polyether sulfone (PES), polyphenyl sulfone (PPSU), polybenzimidazole (PBI), polyimide (PI), polyamideimide (PAI), or PMMA. The second capsule layer 27 may have a melting point higher than the melting point of the first capsule layer 25. For example, if the first capsule layer 25 includes polyphenylene sulfide (PPS) having a melting point of about 280° C., the second capsule layer 27 may include polyether ether ketone (PEEK) having a melting point of about 330° C.

The curing agent granule 29 and/or curing agent grains may be formed in the second capsule layer 27. The second capsule layer 27 may enclose the curing agent granule 29. The curing agent granule 29 may include aliphatic amines, aromatic amines, cycloaliphatic amines, phenalkamines, imidazoles, carboxylic acids, anhydrides, polyamide-based hardeners, phenolic curing agents or waterborne curing agents. The curing agent granule 29 may have a liquid state at room temperature (for example, at 20° C.) and may have a solid state at a temperature higher than room temperature.

Figure 12:
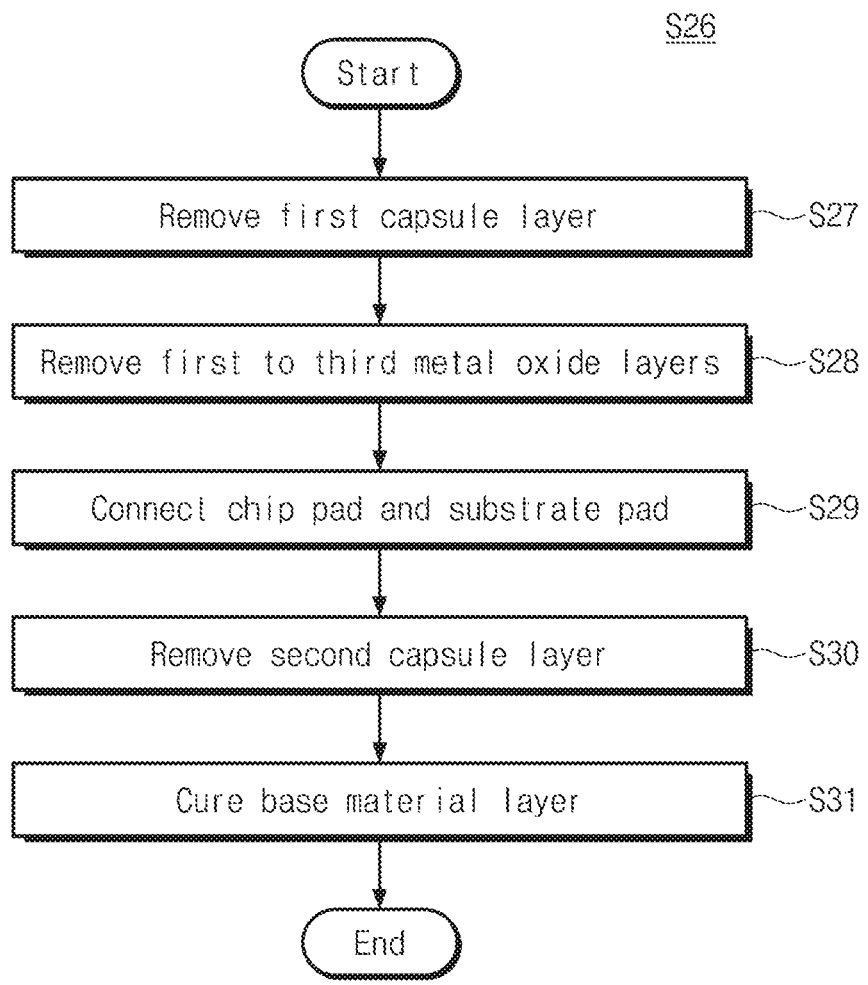
FIG. 12 is a flowchart showing an embodiment of bonding a chip pad to a substrate pad in FIG. 7.

FIG. 12 shows an embodiment of bonding the chip pad 32 to the substrate pad 12 of FIG. 7 (S26).

Referring to FIG. 12, the step of bonding the chip pad 32 to the substrate pad 12 (S26) may include a step of removing the first capsule layer 25 (S27), a step of removing the first to third metal oxide layers 14, 23 and 34 (S28), a step of connecting the chip pad 32 with the substrate pad 12 (S29), a step of removing the second capsule layer 27 (S31), and a step of curing the base material layer 22 (S31).

Referring to FIGS. 5, 11 and 12, the laser light 40 is supplied to the semiconductor chip 30 to remove the first capsule layer 25 using the heat of the laser light 40 (S27). The first capsule layer 25 may be molten and/or removed at a temperature lower than the melting point of the second capsule layer 27. The molten first capsule layer 25 may remain in the base material layer 22 as particles. If the first capsule layer 25 is removed, the reducing agent granules 26 may be exposed to the exterior.

Then, the reducing agent granules 26 remove the first to third metal oxide layers 14, 23 and 34 (S28). The reducing agent granules 26 may be exhausted and/or removed by the oxidation reaction with the first to third metal oxide layers 14, 23 and 34. The reducing agent granules 26 may be dissolved or remain as particles in the base material layer 22. Each of the first to third metal oxide layers 14, 23 and 34 may be reduced to a metal or removed.

If the second metal oxide layer 23 is removed, the solder powders 24 may be combined and/or agglomerated from each other by surface tension to form the bonding junction layer 28. The bonding junction layer 28 may connect the chip pad 32 with the substrate pad 12 (S29). If the reducing agent granules 26 are exhausted and/or removed, the second capsule layer 27 may be exposed to the exterior.

Then, the laser light 40 is additionally supplied onto the semiconductor chip 30 to remove the second capsule layer 27 by the heat of the laser light 40 (S30). The second capsule layer 27 may be molten and/or removed by the heat of the laser light 40. The molten second capsule layer 27 may remain in the base material layer 22 as particles.

Also, the curing agent granules 29 cure the base material layer 22 (S31). The cured base material layer 22 may enclose the bonding junction layer 28. The base material layer 22 may protect the bonding junction layer 28, the substrate pad 12 and the chip pad 32.

Figure 13:
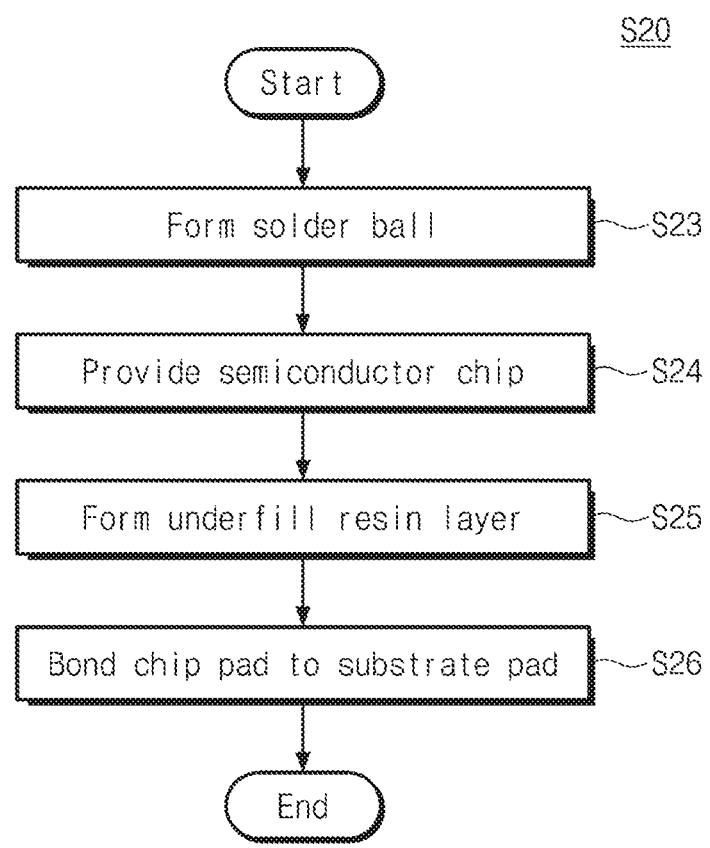
FIG. 13 is a flowchart showing an embodiment of mounting a semiconductor chip in FIG. 1.

FIG. 13 shows an embodiment of mounting the semiconductor chip 30 of FIG. 1.

Referring to FIG. 13, the step of mounting the semiconductor chip 30 (S20) may include a step of forming a solder ball (S23), a step of providing a semiconductor chip (S24), a step of providing an underfill resin layer (S25) and a step of bonding a chip pad to a substrate pad (S26).

FIGS. 14 to 17 are process cross-sectional views showing the step of mounting the semiconductor chip 30 of FIG. 13 (S20).

Figure 14:
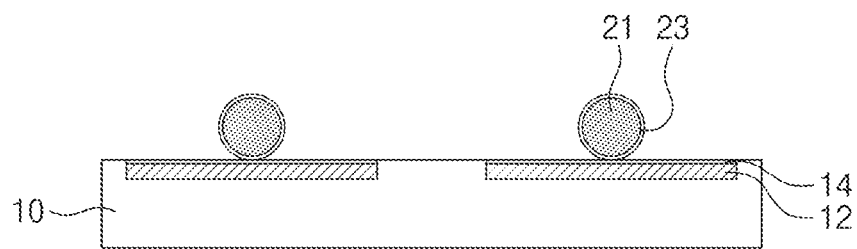
FIGS. 14 to 17 are process cross-sectional views showing a method of fabricating a semiconductor package in FIG. 13.

Referring to FIGS. 13 and 14, a solder ball 21 is formed on a substrate pad 12 (S23). The substrate pad 12 may have a first metal oxide layer 14. The solder ball 21 may include Sn, In, SnBi, SnAgCu, SnAg, Sn, In, AuSn, InSn, BiInSn or InSn. The solder ball 21 may have a size of about 1 μm to about 300 μm. The solder ball 21 may have a second metal oxide layer 23. The first metal oxide layer 14 may be formed on the top surface of the substrate pad 12. The second metal oxide layer 23 may be formed on the outer circumference of the solder ball 21.

Figure 15:
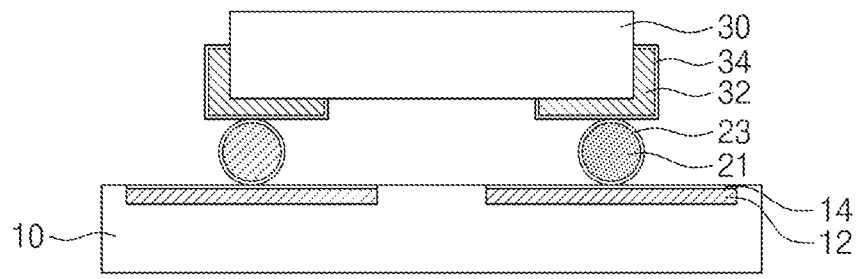

Referring to FIGS. 13 and 15, a semiconductor chip 30 is provided on the solder ball 21 (S24). The chip pad 32 may be provided on the solder ball 21. The chip pad 32 may have a third metal oxide layer 34. The third metal oxide layer 34 may be formed on the bottom surface of the chip pad 32. The solder ball 21 may be formed between the substrate pad 12 and the chip pad 32. Differently, after forming the solder ball 21 on the chip pad 32, the semiconductor chip 30 may be provided on the substrate 10.

Figure 16:
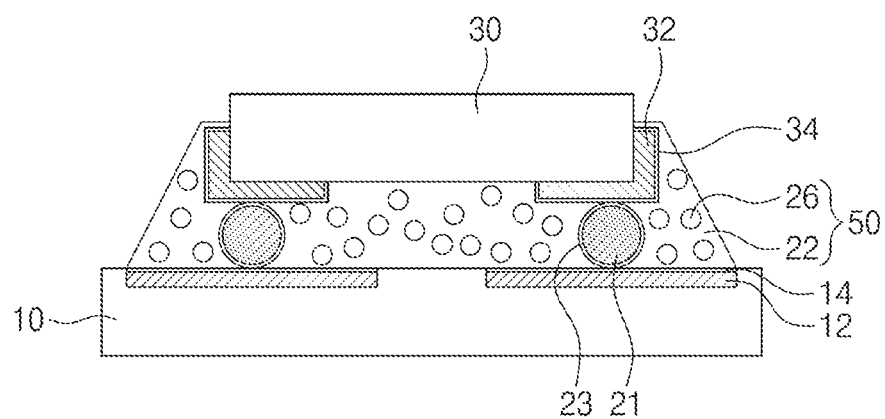

Referring to FIGS. 9, 13 and 16, an underfill resin layer 50 is formed between the semiconductor chip 30 and the substrate 10 (S25). The underfill resin layer 50 may be a non-conductive film (NCF) or a non-conductive paste (NCP). The underfill resin layer 50 may be formed so as to have a thickness of about 2 μm to about 100 μm. According to an embodiment, the underfill resin layer 50 may include a base material layer 22 and reducing agent granules 26. The reducing agent granule 26 may have a first capsule layer 25. The first capsule layer 25 may enclose each of the reducing agent granules 26. The reducing agent granule 26 may be protected by the first capsule layer 25.

Figure 17:
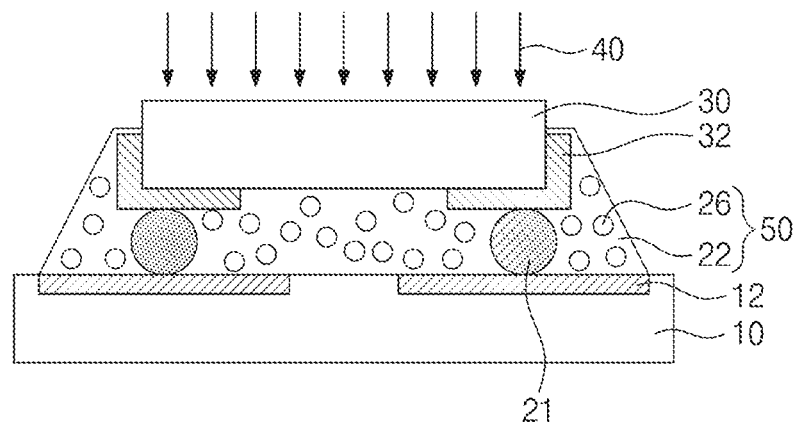

Referring to FIGS. 13 and 17, laser light 40 is irradiated onto the semiconductor chip 30 for bonding the chip pad 32 to the substrate pad 12 (S26). If the laser light 40 heats the semiconductor chip 30 and the underfill resin layer 50, the first capsule layer 25 may be molten and/or removed by the heat of the laser light 40. The molten first capsule layer 25 may remain in the base material layer 22 as particles.

If the first capsule layer 25 is molten and/or removed, the reducing agent granules 26 may reduce the first to third metal oxide layers 14, 23 and 34 to a metal or remove thereof. If the first to third metal oxide layers 14, 23 and 34 are removed, the solder ball 21 may connect the chip pad 32 and the substrate pad 12.

The base material layer 22 may be cured by a curing agent. The cured base material layer 22 may enclose the outer circumference of the solder ball 21. The substrate pad 12, the solder ball 21 and the chip pad 32 may be protected by the base material layer 22.

Figure 18:
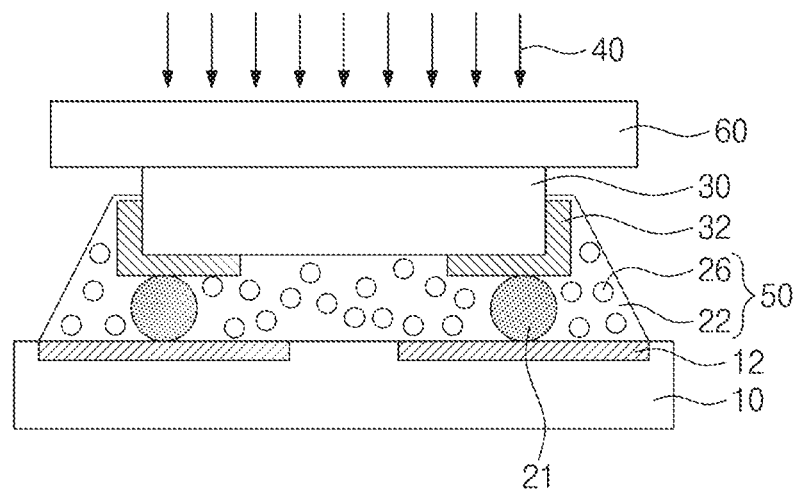
FIG. 18 is a process cross-sectional view showing an embodiment of bonding a chip pad to a substrate pad in FIG. 13.

FIG. 18 is a process cross-sectional view showing an embodiment of bonding the chip pad 32 to the substrate pad 12 of FIG. 13 (S26).

Referring to FIG. 18, in case where the laser light 40 is supplied to the semiconductor chip 30, a transparent substrate 60 may compress the semiconductor chip 30 toward the substrate 10. The transparent substrate 60 may prevent the warpage defect of the semiconductor chip 30. The transparent substrate 60 may include quartz or glass.

The method of fabricating a semiconductor package of the inventive concept may include bonding a semiconductor chip to a substrate using heat generated by laser light. The laser light locally heats a resin layer between the semiconductor chip and the substrate and the semiconductor chip, thereby decreasing the warpage of the substrate.

Although the exemplary embodiments of the present invention have been described, it is understood that the present invention should not be limited to these exemplary embodiments but various changes and modifications can be made by one ordinary skilled in the art within the spirit and scope of the present invention as hereinafter claimed.

What is claimed is:

1. A method of fabricating a semiconductor package, the method comprising:
preparing a package substrate having a substrate pad; and
mounting a semiconductor chip on the substrate pad,
wherein mounting the semiconductor chip comprises:
forming a resin layer between a chip pad of the semiconductor chip and the substrate pad, the resin layer comprising a solder and reducing agent granules having a first capsule layer a second capsule layer in the first capsule layer, and curing agent granules in the second capsule layer; and
bonding the chip pad to the substrate pad using laser irradiated to the semiconductor chip,
wherein bonding the chip pad to the substrate pad comprises:
removing the first capsule layer by heat generated from the laser;
removing first to third metal oxide layers on the substrate pad, the solder and the chip pad using the reducing agent granules; and
connecting the chip pad to the substrate pad.

2. The method of fabricating a semiconductor package of claim 1, wherein the second capsule layer has a melting point higher than the melting point of the first capsule layer.

3. The method of fabricating a semiconductor package of claim 1, wherein the first capsule layer comprises polyphenylene sulfide and the second capsule layer comprises polyether ether ketone.

4. The method of fabricating a semiconductor package of claim 1, wherein the resin layer further comprises a base material layer.

5. The method of fabricating a semiconductor package of claim 4, further comprising:
removing the second capsule layer using the heat generated by the laser; and
curing the base material layer using the curing agent granules.

6. The method of fabricating a semiconductor package of claim 1, wherein the curing agent granules comprise aliphatic amines, aromatic amines, cycloaliphatic amines, phenalkamines, imidazoles, carboxylic acids, anhydrides, polyamide-based hardeners, phenolic curing agents, or waterborne curing agents.

7. The method of fabricating a semiconductor package of claim 1, wherein the reducing agent granules comprise bulky group-substituted hydroxyl compounds or carboxylic acids.

8. The method of fabricating a semiconductor package of claim 1, wherein mounting the semiconductor chip further comprises providing the semiconductor chip on the resin layer.

9. The method of fabricating a semiconductor package of claim 1, wherein the solder comprises a solder ball, and mounting the semiconductor chip comprises:
   forming the solder ball on the substrate pad; and
   providing the semiconductor chip on the solder ball.

10. The method of fabricating a semiconductor package of claim 1, wherein the resin layer further comprises:
    a base material layer; and
    a curing agent which is mixed in the base material layer to cure the base material layer by the heat of the laser.

11. The method of fabricating a semiconductor package of claim 1, wherein bonding the chip pad to the substrate pad further comprises pressing the semiconductor chip into the package substrate by using a transparent block.

* * * * *